United States Patent [19]
Nakajima et al.

[11] Patent Number: 5,611,685
[45] Date of Patent: Mar. 18, 1997

[54] SUBSTRATE HEAT TREATMENT APPARATUS

[75] Inventors: Toshihiro Nakajima; Takatoshi Chiba; Kiyofumi Nishii; Toru Sato, all of Kyoto, Japan

[73] Assignee: Dainippon Screen Mfg. Co., Ltd., Kyoto, Japan

[21] Appl. No.: 450,758

[22] Filed: May 25, 1995

[30] Foreign Application Priority Data

May 30, 1994 [JP] Japan .................................. 6-142362

[51] Int. Cl.⁶ ..................................................... F27B 5/04
[52] U.S. Cl. ........................ 432/205; 432/200; 432/239; 432/247; 432/253
[58] Field of Search .................................. 432/200, 201, 432/205, 239, 247, 253

*Primary Examiner*—Henry A. Bennett
*Assistant Examiner*—Siddharth Ohri
*Attorney, Agent, or Firm*—Lowe, Price, LeBlanc & Becker

[57] ABSTRACT

A substrate heat treatment apparatus includes a heat treatment furnace of a flat configuration, and having a cavity in which a substrate is accommodated. The heat treatment furnace includes a gas supply unit at one side end face, an opening for communication between the cavity and the outside world, and a gas discharge unit in the vicinity of the opening for discharging gas from the cavity at the other side end face. The heat treatment furnace further includes a cover for shutting the opening allowing opening/closing thereof. In the gas exhaust unit, an exhaust chamber is formed on the other side end face along the opening with a partition wall between the opening and the exhaust chamber. An exhaust portion is formed in communication with the outside world in the exhaust chamber. The partition wall is formed so that the edge of the partition wall is displaced away from the inside surface of the cover, whereby a slit-like vent passage extending in the direction of the width of the cavity is formed between the cover and the edge of the partition wall when the opening is shut. The gas flow is uniform in the vicinity of the vent passage when a substrate is loaded/unloaded into and/from the heat treatment furnace, and also during heat treatment. The outside air will not enter the furnace, and no stagnation of the process gas occurs in the furnace.

17 Claims, 5 Drawing Sheets

SUBSTRATE HEAT TREATMENT APPARATUS

BACKGROUND OF THE INVENTION

1. Field of the Invention

The present invention relates to a heat treatment apparatus for a substrate, such as a lamp annealer or a CVD device, for introducing gas into a furnace and applying a heat treatment on a substrate placed in the furnace for annealing, oxidation, nitridation, or film growth thereon. Particularly, the present invention relates to improvement of a structure for discharging gas introduced in a heat treatment furnace.

2. Description of the Related Art

One type of an apparatus for applying a heat treatment on substrates one by one includes a heat treatment furnace of a flat configuration with an opening at one side surface. In this type of heat treatment apparatus, one substrate is loaded into the heat treatment furnace through the opening and then the opening is shut by a cover. Active or inert gas is introduced into the heat treatment furnace. Various heat treatment is applied on the substrate such as annealing, oxidation, nitridation, and film growth on the surface thereof.

In order to improve uniformity and repeatability of the quality of heat treatment and to further increase throughput in such a substrate heat treatment apparatus, gas introduced into the heat treatment furnace must form a uniform flow within the furnace and be smoothly discharged without stagnation. It is also necessary to suppress inflow of outside air into the heat treatment furnace when the opening of the furnace is opened when a substrate is loaded into or unloaded from the furnace.

Figure 1:
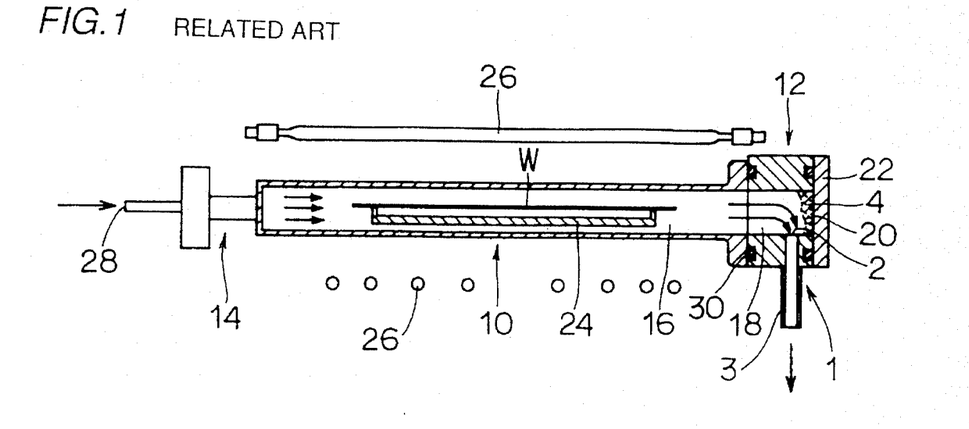
FIG. 1 is a vertical sectional view of the side surface showing the main components of a lamp annealer of related art.

FIG. 1 is a longitudinal sectional view of the structure of the main components of a lamp annealer as an example of such a related heat treatment apparatus of related art. Referring to FIG. 1, a lamp annealer includes a heat treatment furnace of a flat configuration with a rectangular plane, and an opening at one side face. The heat treatment furnace includes a furnace main body 10 formed of quartz glass, and an attach unit integrally formed with furnace main body 10 at the opening side thereof. Furnace main body 10 includes a heat treatment chamber 16 in which a substrate is accommodated.

A gas inlet 14 is provided in furnace main body 10 at a side surface opposite to the side face where the opening is formed. Gas is introduced into heat treatment chamber 16 in furnace main body 10 through gas inlet 14. A substrate W is loaded through the opening into heat treatment chamber 16 of furnace main body 10 one by one.

Referring to the right side of FIG. 1, attach unit 12 includes a fore chamber 18 in communication with heat treatment chamber 16. Attach unit 12 includes an opening 20 of fore chamber 18 formed at one side face thereof and a gas exhaust unit 1 in the proximity of opening 20.

Opening 20 of attach unit 12 can be shut or opened by a cover 22. At the inside side face of cover 22, a connection rod not shown is fixedly attached. This connection rod is further connected to a susceptor 24 supporting substrate W. An O-ring 30 for shielding is provided between cover 22 and a sidewall of attach unit 12, and between a sidewall of attach unit 12 and the side face in which an opening of furnace main body 10 is formed.

A plurality of heat lamps 26 are arranged outside furnace main body 10 so as to respectively face the top furnace wall and the bottom furnace wall of furnace main body 10. The heating lamps facing the top furnace wall and the heat lamps facing the bottom furnace wall are arranged at right angles to each other.

Gas inlet 14 includes a gas supply port 28. Gas supply port 28 is connected to a gas supply unit including a mass flow controller or a switching valve via a piping not shown. Such a gas supply unit selectively provides active or inert gas such as oxygen, ammonia, nitrogen, argon, and nitrogen monoxide via the piping.

Figure 2:
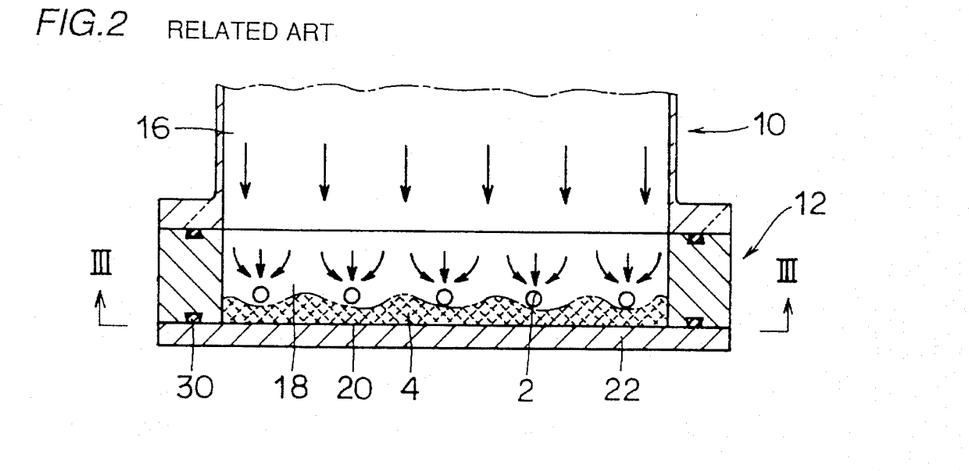
FIG. 2 is an enlarged plan transverse sectional view of the apparatus of FIG. 1 with the end portion of the attach unit.
Figure 3:
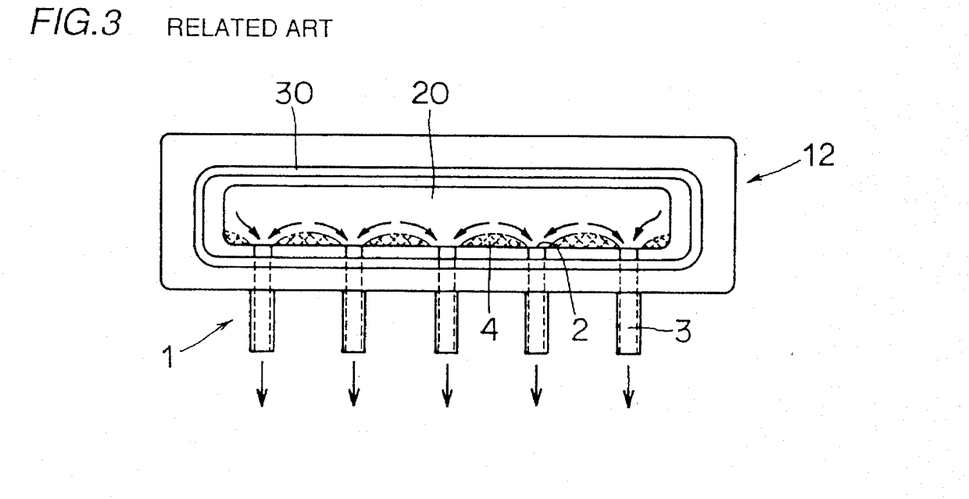
FIG. 3 is an end view taken along the direction of lines III—III of FIG. 2.

FIG. 2 is a plan transverse sectional view of an end portion of attach unit 12 of the lamp annealer of FIG. 1, and FIG. 3 shows an end view thereof taken along lines III—III of FIG. 2.

Referring to FIGS. 2 and 3, a lamp annealer of the related art includes a plurality of exhaust ports formed at the inner wall along the direction of the width of the heat treatment furnace at equal intervals. The gas introduced into heat treatment chamber 16 of the heat treatment furnace through gas inlet 14 flows along the surface of substrate W placed in heat treatment chamber 16 into fore chamber 18 from heat treatment chamber 16. The gas flow in fore chamber 18 is discharged via a plurality of exhaust ports 2 provided along the entire width of the heat treatment furnace at equal intervals.

In the above-described lamp annealer, gas is continuously discharged via gas exhaust unit 1 when a substrate is loaded into heat treatment chamber 16 via opening 20 of fore chamber 18 and also when unloaded from heat treatment chamber 16. The reason is set forth in the following.

In an apparatus that processes a semiconductor wafer having a diameter of 8 inches, for example, as substrate W, gas is introduced into heat treatment chamber 16 via gas inlet 14 at the rate of approximately 3 to 10 l/min. during heat treatment of substrate W with opening 20 of the heat treatment furnace shut. Opening 20 is opened when substrate W is loaded or unloaded into or from heat treatment chamber 16. Here, purge gas of nitrogen gas or the like is introduced via gas inlet 14 into heat treatment chamber 16 at the rate of approximately 20 to 40 l/min. in order to completely discharge gas from heat treatment chamber 16 used for heat treatment and to prevent introduction of outside air into heat treatment chamber 16 via opening 20.

In order to provide a uniform gas flow and reliably discharge the gas used for heat treatment, an approach can be considered where the discharge from gas exhaust unit 1 is inhibited and the used gas is discharged together with the purge gas through opening 20. However, there is problem according to the current reliability of the valve inserted in the piping connected to gas exhaust unit 1 to inhibit this discharge. There is a possibility of increase in the pressure in the heat treatment chamber 16 depending upon the operating time of the valve when opening 20 is shut by cover 22 after a substrate to be subjected to heat treatment is loaded into heat treatment chamber 16. The operator will be subjected to danger when the gas used for heat treatment is hazardous gas. Therefore, gas is continuously discharged via gas discharge unit 1 when substrate W is loaded or unloaded into or from heat treatment chamber 16 via opening 20.

Figure 4:
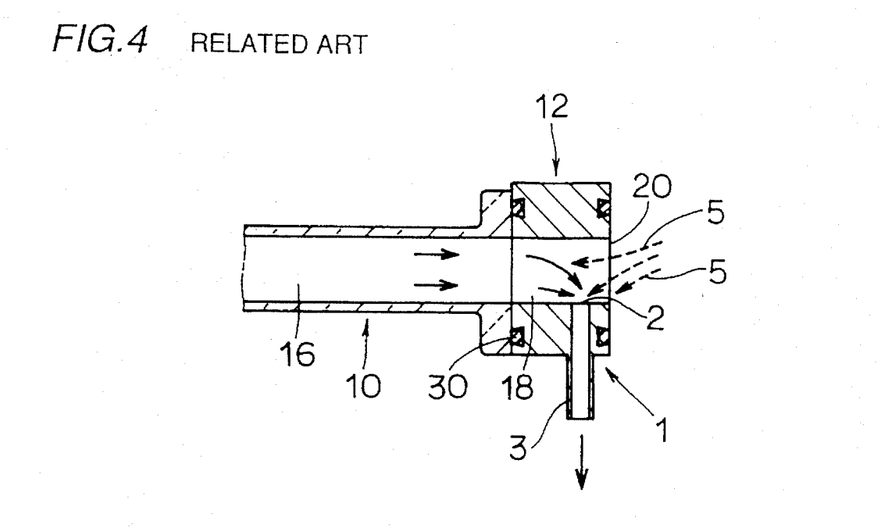
FIG. 4 is an enlarged vertical sectional view of the device of FIG. 1 with the end portion of the attach unit shown, where the cover is open for loading/unloading a substrate into/from the heat treatment chamber.
Figure 5:
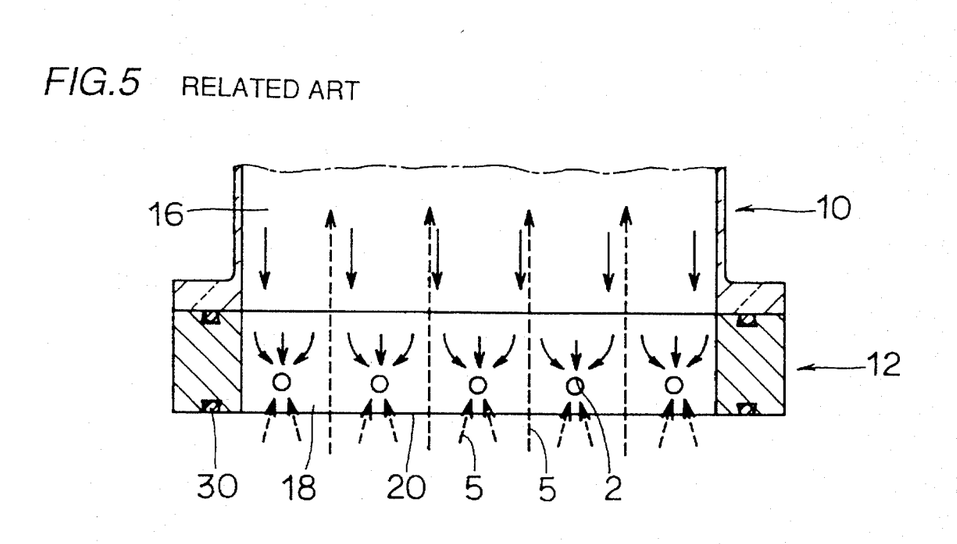
FIG. 5 is an enlarged plan transverse sectional view of the apparatus of FIG. 1 with the portion of the attach unit shown.

Referring to FIGS. 4 and 5, it is assumed that the gas flow into fore chamber 18 from heat treatment chamber 16 is drawn and discharged via exhaust port 2 while opening 20 is open. In this case, a local rapid flow of gas occurs at the periphery of each exhaust port 2, and a current flow towards the interior of heat treatment chamber 16 is generated. As a result, there is a possibility of ingress of outside air 5 into heat treatment chamber 16 via the spacing between adjacent exhaust ports 2 as shown in FIG. 5. Outside air 5 may reach considerably into the interior of heat treatment chamber 16 due to convection caused by heat in heat treatment chamber 16.

Under such conditions, there is possibility of the atmosphere component remaining within heat treatment chamber 16 even after opening 20 is shut by cover 22 when substrate W is loaded therein. Such a component will adversely affect the subsequent heat treatment of substrate W.

The interior of heat treatment chamber 16 can be purged with inert gas for a relatively long time period prior to heat treatment to completely discharge the atmosphere component from heat treatment chamber 16. However, a long time will be required before a heat treatment is initiated, so that the throughput of the heat treatment is degraded. Furthermore, the running cost of the device may be increased due to increase of the consumed amount of gas.

When exhaust is carried out via exhaust port 2 provided at the inner wall of attach unit 12 during a heat treatment, a stagnation portion 4 of gas flow is generated at the cavity between exhaust port 2 and cover 22 as shown in FIGS. 1–3. When the type of gas introduced is to be exchanged, the gas within heat treatment chamber 16 cannot be replaced smoothly. The gas exchange operation is time consuming to degrade the throughput of the apparatus.

SUMMARY OF THE INVENTION

In view of the foregoing, an object of the present invention is to provide a heat treatment apparatus processing a substrate one by one, improved in uniformity and repeatability of the quality of heat treatment, and that realizes a higher throughput.

Another object of the present invention is to provide a heat treatment apparatus processing a substrate one by one, improved in uniformity and repeatability of the quality of heat treatment and also high throughput by preventing outside air from entering a heat treatment furnace through an opening in loading/unloading a substrate into/from the furnace.

A further object of the present invention is to provide a heat treatment apparatus processing a substrate one by one, improved in uniformity and repeatability of the quality of heat treatment and with a higher throughput by preventing outside air from entering a heat treatment chamber via an opening in loading/unloading a substrate into/from the furnace, and eliminating stagnation of gas within the furnace that is to be discharged therefrom during heat treatment.

A substrate heat treatment apparatus according to the present invention includes a heat treatment furnace having at least two side end faces. The entire heat treatment furnace has a flat configuration with a cavity where a substrate is accommodated. At the side of one of the two side end faces of the heat treatment furnace, a gas supply unit for providing gas to the cavity is provided. At the other side face end, an opening for providing communication between the cavity and the outside world, and a gas exhaust unit in the proximity of the opening for discharging gas from the cavity are provided. The heat treatment furnace further includes a cover to shut and open the opening. In the gas discharge unit, an exhaust chamber is formed on the other side end face along the opening and with a partition wall therebetween. An exhaust port is formed in the exhaust chamber communicating with the outside world. The partition wall is formed so that at least one part of the edge thereof is displaced closer to the one side end face from the other side end face. Thus, a vent passage is formed extending along the direction of the width between the inside surface of the cover and the edge of the partition wall when the cover is shut.

According to another aspect of the present invention, a substrate heat treatment apparatus includes a heat treatment furnace having at least two side end faces. The heat treatment furnace has a flat configuration and a cavity in which a substrate is accommodated. The heat treatment furnace includes a gas supply unit at one of the two side end faces for supplying gas into the cavity. At the other side end face, an opening providing communication between the cavity and the outside world, and a gas exhaust unit in the proximity of the opening for discharging gas from the cavity are provided. The heat treatment furnace includes a cover for shutting and opening the opening. The cavity has a step-graded face at the proximity of the other side end face to be greater in height than the other portion. An exhaust port is formed communicating with the outside world in the step-graded face. The gas exhaust unit includes a partition wall across the entire width of the cavity along the step of the step-graded face and towards the other side end face. The partition wall is formed so that at least one portion of the edge thereof is displaced closer to the one side end face side from the other side end face side. Therefore, a vent passage extending in the direction of the width is formed between the inside surface of the cover and the edge of the partition wall when the opening is shut.

When a substrate is loaded/unloaded into/from the heat treatment furnace via the opening of the heat treatment furnace, purge gas introduced into the furnace from the gas inlet and arriving at the vicinity of the opening enters an exhaust chamber or a region in the proximity of the step-graded face where the exhaust port is formed so as to bypass the edge of the partition wall. The gas further flows into the exhaust chamber or towards the exhaust port at the step-graded face to be discharged outward. The purge gas flows towards the exhaust port, not directly, but by means of bypassing the edge of the partition wall. Even though there may be a local rapid gas flow around the exhaust port, the gas flow in the proximity of the opening of the heat treatment furnace forms a uniform flow across the entire width direction from the furnace to the exhaust chamber, or from the furnace to the region in the vicinity of the step-graded surface. Generation of a rapid flow of gas locally in the vicinity of the opening will not occur. The outside air in the proximity of the opening is drawn towards the exhaust port that is isolated from the cavity of the furnace by the partition wall, and there is no flow of the outside air into the furnace. Therefore, entrance of outside air into the furnace via the opening is prevented.

During heat treatment, the gas introduced into the furnace from the gas inlet towards the opening passes through a vent passage defined by the inside surface of the cover that shuts the opening and the edge of the partition wall to the exhaust port partially isolated from the cavity in the furnace by the partition wall. Since the gas flows along the inside surface of the cover, there is no stagnation of the gas flow in the vicinity of the cover. Therefore, when the type of gas to be introduced is changed, this gas exchange is carried out speedily to improve the throughput of the apparatus.

The partition wall may be formed so that the edge of the partition wall is displaced closer to the one side end face from the other side end face along the entire width of the cavity. This allows the formation of a vent passage having a length substantially across the entire width of the cavity, between the inside surface of the cover and the edge of the partition wall when the opening is shut. The width of the vent passage is preferably constant.

The partition wall may be formed so that the edge thereof is displaced closer to the one side end face from the other side end face at a plurality of positions along the width of the cavity, and in flush with the other side end face at other positions. Therefore, a plurality of vent passages are formed between the cover and the edge of the partition wall when the opening is shut along the direction of the width of the cavity. The partition wall may be formed so that the vent passages are disposed at substantially equal intervals all along the entire width of the cavity. The partition wall may be formed so that each vent passage may have a slit configuration of a constant width. The plurality of vent passages may have the same configuration.

Furthermore, the heat treatment furnace can include the heat treatment furnace main body and the attach unit. The main body of the heat treatment furnace includes a gas supply unit at one side end face, and defines a cavity having an opening at the other side end face. The attach unit is fixed to the side surface including the opening of the main body. The attach unit includes a fore chamber in communication with the cavity and forming an opening of the heat treatment furnace. The gas exhaust inlet is provided at the attach unit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 6–9 show a lamp annealer which is a preferred embodiment of a substrate heat treatment apparatus according to the present invention. In FIGS. 6–9, components corresponding to those shown in FIGS. 1–4 have the same reference character and label denoted. The functions thereof are also similar. Therefore, the details thereof will not be repeated here.

Figure 7:
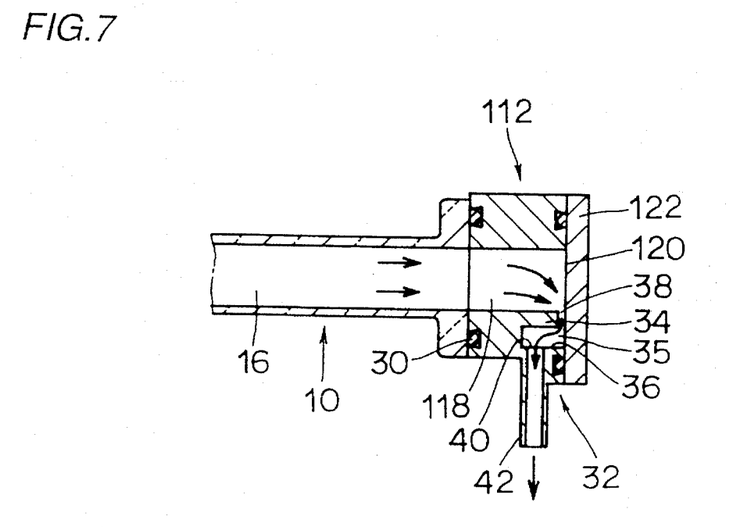
FIG. 7 is an enlarged vertical sectional view of the apparatus of FIG. 6 with the end portion where the attach unit is provided is shown.
Figure 8:
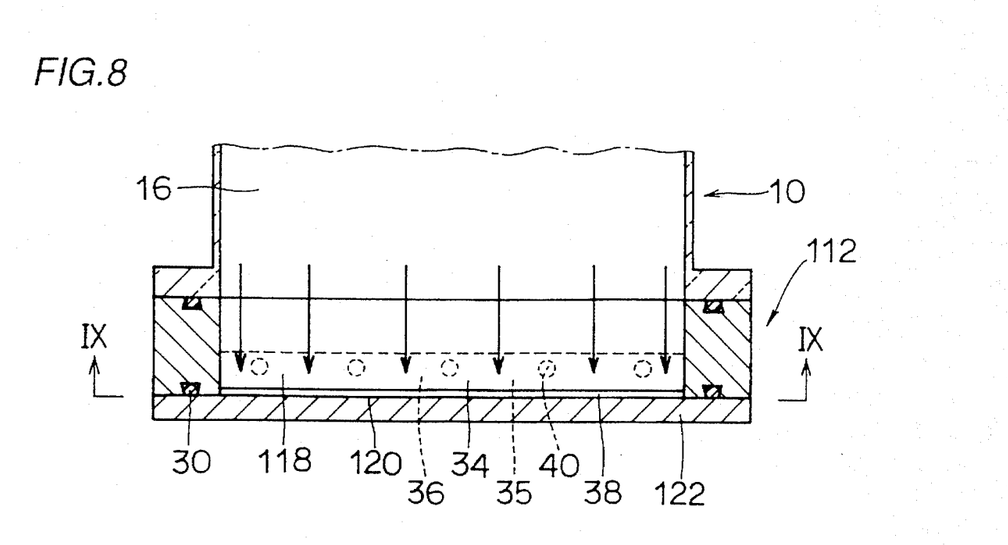
FIG. 8 is an enlarged plan transverse sectional view of the device of FIG. 6 showing the portion of the attach unit shown.
Figure 9:
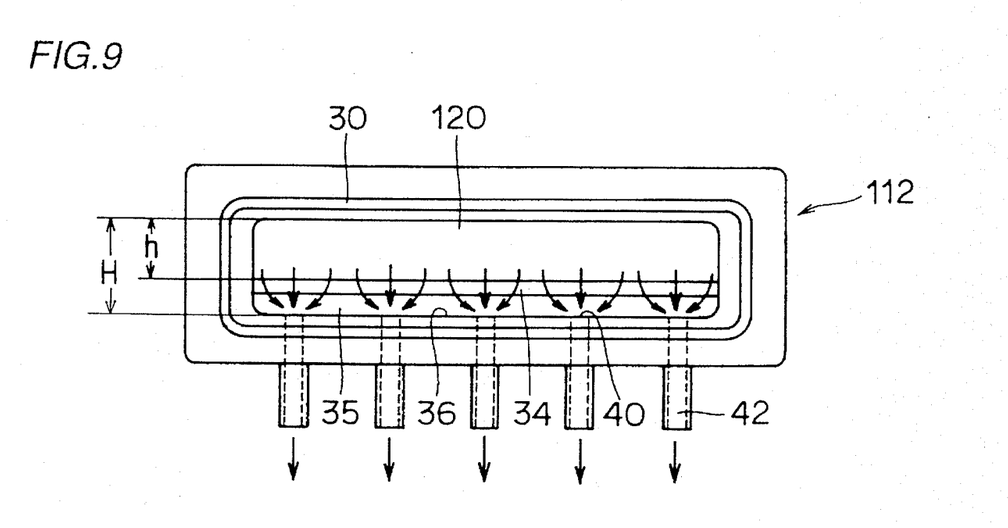
FIG. 9 is an end view taken along the direction of lines IX—IX of FIG. 8.

Referring to FIGS. 7–9, the lamp annealer of the present embodiment is characterized by including an attach unit 112 for gas discharge that has a structure different from that of the lamp annealer shown in FIGS. 1–4.

Figure 6:
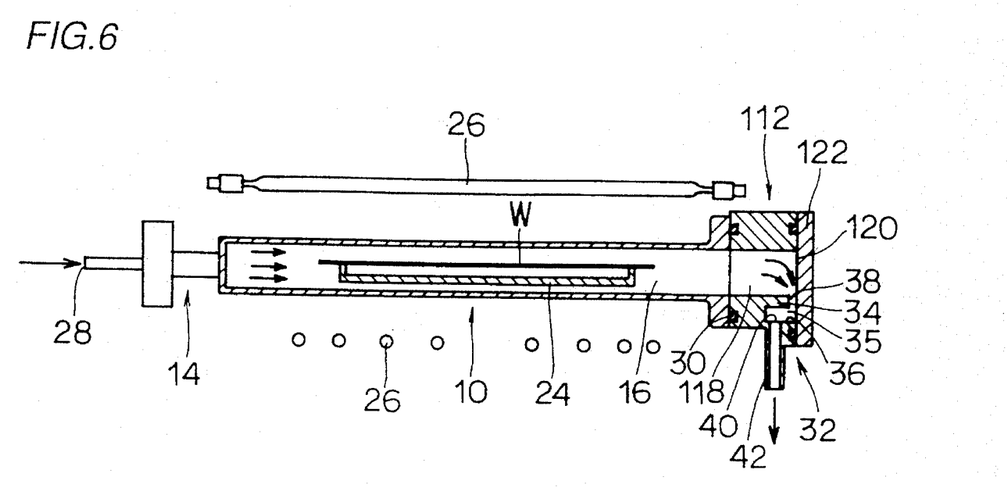
FIG. 6 is a vertical sectional view of the main components of a lamp annealer according to an embodiment of the present invention.

The lamp annealer of the present embodiment has a furnace main body 10 formed of a quartz glass material. Similar to the main furnace main body of the related art, furnace main body 10 has a flat configuration with an opening at one side end. Furnace main body 10 includes a heat treatment chamber 16 therein. At the opening side, an attach unit 12 formed of stainless steel is provided.

Attach unit 112 has a structure different from that of attach unit 12 of the lamp annealer of the related art. More specifically, attach unit 112 includes a fore chamber 118 in communication with heat treatment chamber 16. Attach unit 112 is formed with an opening 120 at a side face opposite to that of heat treatment chamber 16 (referred to as "outside surface" hereinafter). Below opening 120 at the outside surface, an exhaust chamber 35 is cut away from the outside surface towards heat treatment chamber 16 along the entire width direction of a partition wall 34 provided therebetween.

Partition wall 34 is cut away so that the leading edge of the outside surface side is located inner of the outside surface, i.e., displaced closer to heat treatment chamber 16 from the position of the outside surface. When opening 120 is closed by a cover 122, a slit-like vent passage is formed between the edge plane of wall partition 34 and the inside surface of cover 122 entirely along the width of the heat treatment furnace. The width of this slit-like vent passage 38 is preferably constant all over. However, this is not critical.

Viewing attach unit 112 from the side of opening 120 as shown in FIG. 9, a bottom inside wall 36 of opening 120 is formed so as to have a step of a height H, whereby the height of opening 120 is greater than a height h of the inner transverse cross section of heat treatment chamber 16 of the heat treatment furnace. Step-graded face 36 which is the bottom surface of exhaust chamber 35 has a plurality of exhaust ports 40 formed at equal intervals along the width direction of the heat treatment furnace with an upward opening towards the bottom plane of partition wall 34. The plurality of exhaust ports 40 communicate with an exhaust pump via respective exhaust tubes 42 to form a gas exhaust unit 32.

In a lamp annealer of the present embodiment including the above-described gas exhaust unit 32, the gas flows during heat treatment as set forth in the following. Cover 122 is shut. Active or inert gas introduced into heat treatment chamber 16 from gas inlet 14 flows through heat treatment chamber 16 rightwards in FIG. 6 into fore chamber 118. The gas passes vent passage 38 between the edge face of wall partition 34 and the inside surface of cover 122 to flow into exhaust chamber 35, i.e. into a region in the vicinity of step-graded face 36. Exhaust chamber 35 is defined by the bottom face of wall partition 34, the inner end face of the concave portion of the lower face wall portion of attach unit 112, step-graded face 36, and the inside surface of cover 122. Then, the gas flows towards the plurality of exhaust ports 40 formed at step-graded face 36 to be discharged through exhaust tubes 42.

Thus, the gas flows from the cavity of the furnace through slit-like vent passage 38 formed in the proximity of opening 120 within attach unit 112 continuously across the entire width direction of the heat treatment furnace. The gas is discharged from the heat treatment furnace through exhaust ports 40 formed at the bottom face of exhaust chamber 35 which are partially isolated from the cavity of the furnace by partition wall 34. As shown by the arrows in FIGS. 7–9, there is no stagnation of gas in the vicinity of cover 122 at the trailing edge of the cavity of the furnace. Even when the type of gas introduced into heat treatment chamber 16 is changed, the gas exchange is carried out smoothly.

Figure 10:
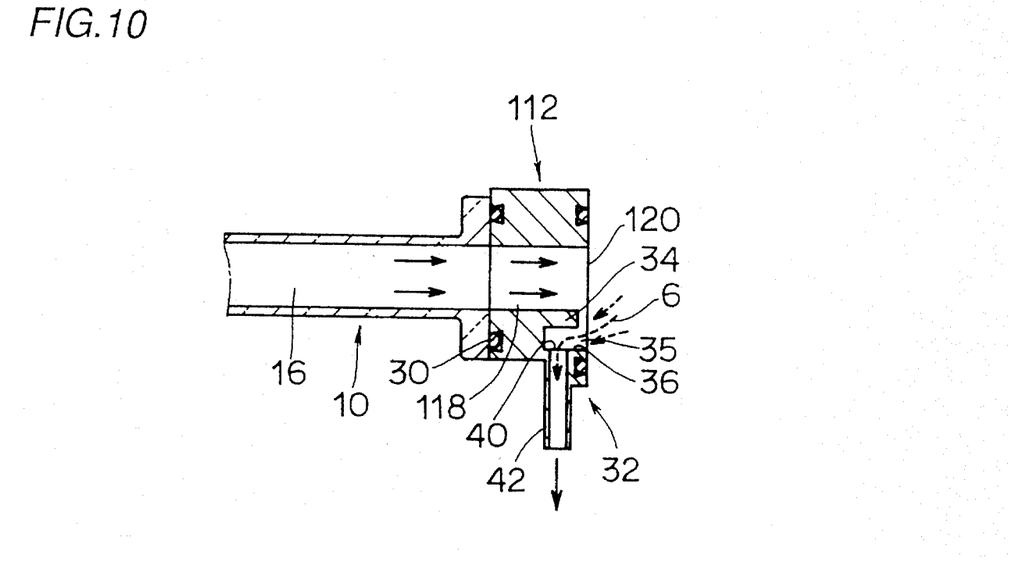
FIG. 10 is an enlarged vertical sectional view of the apparatus of FIG. 6 with the portion of the attach unit shown, where the cover is open to load/unload a substrate into/from the heat treatment chamber through the opening.

The gas flow when a substrate is loaded or unloaded into or from heat treatment chamber 16 through opening 120 is set forth in the following. Referring to FIG. 10, cover 122 is open. A purge gas such as nitrogen gas is introduced from gas inlet 14 at the rate of approximately 20–40 l/min.

The purge gas approaching opening 120 passes through the edge of wall partition 34 to flow into exhaust chamber 35 enclosed by the bottom face of wall partition 34, the concave inner end face formed at the bottom wall portion of attach unit 112, and step-graded face 36. The purge gas is drawn towards the plurality of exhaust ports 40 formed at step-graded face 36 together with outside air 6 around opening 120 to be discharged through exhaust tubes 42.

There is possibility of a rapid flow of gas locally in the vicinity of exhaust port 40 partially isolated from the cavity of the furnace by partition wall 34. However, a uniform gas flow is achieved along the entire width of the heat treatment furnace in the vicinity of opening 120. There is no generation of a rapid gas flow locally in the vicinity of opening 120. Therefore, the disadvantage of a rapid gas flow from the outside world towards the interior of the heat treatment chamber encountered in an apparatus of the related art is eliminated. The outside air is prevented from entering the interior of the furnace through opening 120.

The present invention is not limited to a lamp annealer described above, and may be generally applied to an apparatus that has active or inert gas introduced into a furnace for applying heat treatment on a substrate one by one. For example, the present invention can be applied to a CVD apparatus.

In the above-described lamp annealer, a heat treatment furnace includes a furnace main body formed of quartz glass or the like, and an attach unit formed by working a metal material such as stainless steel. A gas exhaust unit is provided in the attach unit. Process applied on the furnace main body can be simple. Therefore, the heat treatment chamber can be manufactured easily.

It is to be noted that the present invention is not only effective in a lamp annealer that is formed of a separate furnace main body and an attach unit. A heat treatment furnace of an integral structure formed of the same material with an exhaust chamber, a partition wall, a step-graded face, and an exhaust port of the above-described manner is included in the scope of the invention of the present application.

The apparatus of the present embodiment has an exhaust chamber, a partition wall, a step-graded face, and an exhaust port all formed at the bottom wall portion of the heat treatment furnace. It is to be noted that the positions thereof are not limited to those of the present embodiment. For example, these elements may be provided only at the top face wall portion, or at both the top face wall portion and the bottom face wall portion, or at the wall portion around the circumference of the heat treatment furnace. In the present embodiment, a plurality of discharge ports are provided at equal intervals along the entire width of the heat treatment furnace at the step-graded face. The arrangement and configuration thereof are not limited to those of the present embodiment. For example, only one exhaust port that extends along the entire width of the heat treatment furnace may be employed. Alternatively, the configuration of the exhaust port may include a plurality of slits.

Figure 11:
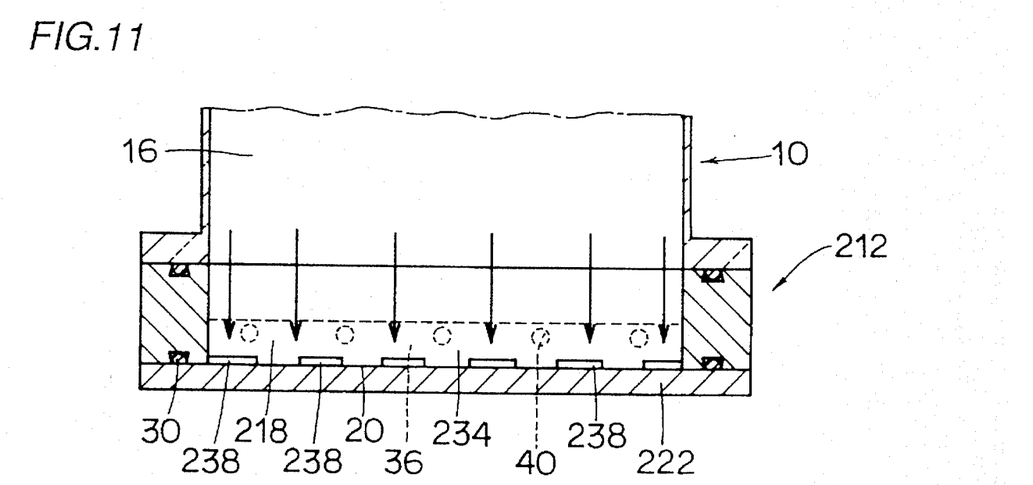
FIG. 11 is a plan transverse sectional view showing another embodiment of the present invention.

In the present embodiment, the configuration of the inside surface of the cover and the edge face of the wall partition is selected so that the configuration of the vent passage between the end face of the wall partition and the inside surface of the cover has a continuous slit across the entire width direction. Alternatively, as shown by an attach unit 212 of FIG. 11, the configuration of a vent passage 238 from fore chamber 218 to the exhaust chamber may be selected so as to include a plurality of discontinuous slits. In FIG. 11, components corresponding to those shown in FIGS. 1–10 have the same reference characters denoted. The function thereof are also identical. Therefore, detailed description thereof will not be repeated here.

In the embodiment shown in FIG. 11, the slits are arranged at equal intervals. The configuration is similar and the width of each slit is constant. However, the present invention is not limited to this embodiment, and the interval, configuration, and width of the slit do not have to be constant.

According to a substrate heat treatment apparatus of the present invention, outside air is prevented from entering a heat treatment furnace through an opening provided at one side surface of the furnace when a substrate is loaded or unloaded into or from the furnace through the opening. When the opening is shut and a substrate is subjected to a heat treatment, there is no stagnation of gas in the proximity of the gas exhaust unit. Gas is smoothly discharged from the furnace. Thus, a substrate heat treatment apparatus is provided improved in uniformity and repeatability of the heat treatment quality of a substrate, and that has a higher throughput.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate heat treatment apparatus including a heat treatment furnace having at least two side end faces, a flat configuration as a whole, and a cavity in which a substrate is accommodated, said heat treatment furnace comprising a gas supply unit for supplying a gas into said cavity at one of said two side end faces, an opening for communication between said cavity and the outside world and a gas exhaust unit in the vicinity of said opening for discharging gas from said cavity at the other of said two side end faces, and a cover for shutting said opening in an open/close manner, said gas exhaust unit comprises an exhaust chamber formed on said other side end face along said opening, with a partition wall between said opening and said partition wall, wherein an exhaust port in communication with the outside world is formed in said exhaust chamber, wherein said partition wall is formed so that at least a portion of an edge thereof is displaced closer to said one side end face from said other side end face, whereby a vent passage is formed extending in a direction of a width of said cavity between an inside surface of said cover and the edge of said partition wall when said opening is shut.

2. The substrate heat treatment apparatus according to claim 1, wherein said partition wall is formed so that an edge thereof is displaced closer to said one side end face from said other side end face substantially all along the entire width of said cavity, whereby a vent passage is formed having a length substantially across the entire width of said cavity between an inside surface of said cover and the edge of said wall partition when said opening is shut.

3. The substrate heat treatment apparatus according to claim 2, wherein said partition wall is formed so that an edge thereof is displaced closer to said one side end face from said other side end face by a predetermined constant length substantially across the entire width of said cavity, whereby a continuous vent passage having a length entirely across the width of said cavity and a constant width is formed between an inside surface of said cover and the edge of said partition wall when said opening is shut.

4. The substrate heat treatment apparatus according to claim 1, wherein said partition wall is formed so that an edge thereof is displaced closer to said one side end face side from said other side end face side at a plurality of positions along the width of said cavity, and so as to be flush with said other side end face at other positions, whereby a plurality of vent passages are formed arranged in a direction of the width of said cavity, between an inside surface of said cover and the edge of said partition wall when said opening is shut.

5. The substrate heat treatment apparatus according to claim 4, wherein said wall partition is formed so that said plurality of vent passages are formed at equal intervals substantially entirely across a direction of the width of said cavity.

6. The substrate heat treatment apparatus according to claim 5, wherein said partition wall is formed so that each of said plurality of vent passages formed between an inside surface of said cover and the edge of said partition wall when said opening of said heat treatment furnace is shut includes a slit of a substantially constant width.

7. The substrate heat treatment apparatus according to claim 6, wherein said partition wall is formed so that said plurality of vent passages have the same configuration.

8. The substrate heat treatment apparatus according to claim 5, wherein said partition wall is formed so that said plurality of vent passages have the same configuration.

9. The substrate heat treatment apparatus according to claim 1, wherein said heat treatment furnace comprises said gas supply unit at said one side end face side, and a heat treatment furnace main body defining said cavity and having an opening at said other side end face side, and an attach unit attached to a side surface having said opening of said heat treatment furnace main body, said attach unit including said chamber forming said opening of said heat treatment furnace and in communication with said cavity, wherein said gas exhaust unit is provided in said attach unit.

10. The substrate heat treatment apparatus according to claim 9, wherein said partition wall is formed so that an edge thereof is displaced closer to said one side end face side from said other side end face side entirely across the width of said cavity, whereby a continuous vent passage having a length substantially across the entire width of said cavity is formed between an inside surface of said cover and the edge of said partition wall when said opening is shut.

11. The substrate heat treatment apparatus according to claim 10, wherein said partition wall is formed so that an edge thereof is displaced closer to said one side end face side from said other side end face side by a predetermined constant length substantially across the entire width of said cavity, whereby a continuous vent passage having a length substantially across an entire width of said cavity, and a constant width is formed between an inner surface of said cover and the edge of said partition wall when said opening is shut.

12. The substrate heat treatment apparatus according to claim 9, wherein said partition wall is formed so that an edge thereof is displaced closer to said one side end face side from said other side end face side at a plurality of positions along the width of said cavity, and is flush with said other side end face at other positions, whereby a plurality of vent passages arranged in a direction of the width of said cavity are formed between an inside face of said cover and an edge of said partition wall when said opening is shut.

13. The substrate heat treatment apparatus according to claim 12, wherein said partition wall is formed so that said plurality of vent passages are arranged substantially at equal intervals entirely along direction of a width of said cavity.

14. The substrate heat treatment apparatus according to claim 13, wherein said partition wall is formed so that each of said plurality of vent passages formed between an inside surface of said cover and the edge of said partition wall when said opening of said heat treatment furnace is shut has a slit configuration with a substantially constant width.

15. The substrate heat treatment apparatus according to claim 14, wherein said partition wall is formed so that said plurality of vent passages have a same configuration.

16. The substrate heat treatment apparatus according to claim 13, wherein said partition wall is formed so that said plurality of vent passages have a same configuration.

17. A substrate heat treatment apparatus including a heat treatment furnace having at least two side end faces, and a flat configuration as a whole, and having a cavity in which a substrate is accommodated, said heat treatment furnace comprising a gas supply unit for providing gas to said cavity at one of said two side end faces, and an opening for communication between said cavity and the outside world, and a gas exhaust unit in the vicinity of said opening for discharging gas from said cavity at the other of said two side end faces, and a cover for shutting said opening in an open and close manner, said cavity including a step-graded face formed in the proximity of said other side end face to have a height (H) at said other side end face greater than a height (h) of the other portion, wherein an exhaust port in communication with the outside world is formed in said step-graded face, said gas exhaust unit including a partition wall formed along a step of said step-graded face entirely across the width of said cavity and towards said other side end face, wherein said wall partition is formed so that at least a portion of an edge thereof is displaced closer to said one side end face side from said other side end face side, whereby a vent passage extending in a direction of the width of said cavity is formed between an inside surface of said cover and the edge of said wall partition when said opening is closed.

* * * * *